United States Patent
Brueck et al.

(10) Patent No.: US 9,466,739 B1
(45) Date of Patent: Oct. 11, 2016

(54) SURFACE PLASMA WAVE COUPLED DETECTORS

(71) Applicants: Steven R. J. Brueck, Albuquerque, NM (US); Sanjay Krishna, Albuquerque, NM (US); Seung-Chang Lee, Albuquerque, NM (US)

(72) Inventors: Steven R. J. Brueck, Albuquerque, NM (US); Sanjay Krishna, Albuquerque, NM (US); Seung-Chang Lee, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 8 days.

(21) Appl. No.: 14/213,691

(22) Filed: Mar. 14, 2014

Related U.S. Application Data (60) Provisional application No. 61/787,570, filed on Mar. 15, 2013.

(51) Int. Cl.
  *H01L 31/0232* (2014.01)
  *H01L 31/18* (2006.01)
  *H01L 31/0352* (2006.01)

(52) U.S. Cl.
  CPC . *H01L 31/02327* (2013.01); *H01L 31/035236* (2013.01); *H01L 31/184* (2013.01)

(58) Field of Classification Search
  CPC .............. H01L 31/02327; H01L 31/0264; H01L 31/028; H01L 31/0304
  See application file for complete search history.

(56) References Cited

U.S. PATENT DOCUMENTS 6,005,259 A * 12/1999 Su et al. .................. 257/15

FOREIGN PATENT DOCUMENTS

WO   WO 2011050165 A2 *  4/2011

OTHER PUBLICATIONS

W.M. Haynes, CRC Handbook of Chemistry and Physics, "Optical Properties of Selected ELements" and "Optical Properties of Selected Inorganic and Organic Solids", 95th Edition, Internet Version 2015, pp. 12-151 to 12-169.*
S.C. Lee et al., "Light Direction-Dependent Plasmonic Enhancement in Quantum Dot Infrared Photodetectors," Applied Physics Letters 97, 2010, 021112 (3 pages).
S.C. Lee et al., "Leaky-Mode Effects in Plasmonic-Coupled Quantum Dot Infrared Photodetectors," Applied Physics Letters 100, 2012, 011110 (4 pages).
Sang Jun Lee et al., "A Monolithically Integrated Plasmonic Infrared Quantum Dot Camera," Nature Communications, published Apr. 19, 2011, pp. 1-6.
Jing Chen et al., "Surface Plasmon Modes of Finite, Planar, Metal-Insulator-Metal Plasmonic Waveguides," Optics Express, Sep. 15, 2008, vol. 16, No. 19, pp. 14902-14909.
S.C. Lee et al., "Quantum Dot Infrared Photodetector Enhanced by Surface Plasma Wave Excitation," Optics Express, Dec. 7, 2009, vol. 17, No. 25, pp. 23160-23168.
Zahyun Ku et al., "Analysis of Subwavelength Metal Hole Array Structure for the Enhancement of Back-Illuminated Quantum Dot Infrared Photodetectors," Optics Express, Feb. 25, 2013, vol. 21, No. 4, pp. 4709-4716.

* cited by examiner

*Primary Examiner* — Yu Chen
(74) *Attorney, Agent, or Firm* — MH2 Technology Law Group, LLP (57) ABSTRACT

The present disclosure relates to an electromagnetic energy detector. The detector can include a substrate having a first refractive index; a metal layer; an absorber layer having a second refractive index and disposed between the substrate and the metal layer; a coupling structure to convert incident radiation to a surface plasma wave; additional conducting layers to provide for electrical contact to the electromagnetic energy detector, each conducting layer characterized by a conductivity and a refractive index; and a surface plasma wave ("SPW") mode-confining layer having a third refractive index that is higher than the second refractive index disposed between the substrate and the metal layer.

18 Claims, 7 Drawing Sheets

SURFACE PLASMA WAVE COUPLED DETECTORS

CROSS REFERENCE TO RELATED APPLICATIONS

This application claims priority to U.S. Provisional Patent Application Ser. No. 61/787,570, titled "Optimization of Surface Plasma Wave Coupled Detectors," filed on Mar. 15, 2013, and is related to U.S. patent application Ser. No. 13/502,987 titled "Plasmonic Detectors," filed on Apr. 19, 2012, which claims priority to U.S. Provisional Patent Application Ser. Nos. 61/279,435, filed on Oct. 21, 2009 and 61/339,185, filed on Mar. 1, 2010, which are hereby incorporated by reference in their entirety.

GOVERNMENT INTEREST

This invention was made with U.S. Government support under Grant No. FA9550-12-1-0049 awarded by the Air Force Office of Scientific Research. The U.S. Government has certain rights in the invention.

TECHNICAL FIELD

This disclosure generally relates to plasmonic detectors. In particular, this disclosure relates to plasmonic structures and their use in resonantly enhancing the performance of infrared detectors.

BACKGROUND

There is increasing interest in using surface plasma waves or other bound local modes to both increase the interaction of incident radiation with detectors and also to provide spectral selectivity. Ongoing work covers both the infrared and the visible spectral regions.

In the visible there is a need for spectral/angular resolution compatible with inexpensive silicon fabrication. While color cameras are ubiquitous, the spectral resolution is provided typically by absorbing dyes, which are increasingly difficult to fabricate with sufficient absorbance as the pixel size decreases, and provide only limited spectral selectivity.

In the infrared, detector signal-to-noise is an important driver. Detectors cooled to cryogenic temperatures provide the highest sensitivity, but require extensive and expensive infrastructure limiting their applicability. Uncooled detectors, typically based on thermal heating of an isolated structure by infrared radiation, have limitations associated with high noise levels and limited response speed.

Surface plasma wave (SPW) and other guided mode interactions provide a method to address some of these issues. There are two related classes of SPWs. For a planar interface between a metal and a dielectric (such as a semiconductor material), there is a mode bound to the interface (e.g., a slow wave that is propagating along the interface and evanescent (exponentially decreasing in amplitude) into both the metal and the dielectric). This wave is well defined for $Re(-\epsilon_m) > Re(\epsilon_d)$ where $\epsilon_m$ is the permittivity of the metal (with a negative real part) and $\epsilon_d$ is the dielectric permittivity. For isolated metal structures, there are localized SPW resonances that concentrate the fields, this localized resonance is involved in the well-known surface enhanced Raman scattering (SERS) effect.

Much of the analysis of SPW modes at a planar metal/dielectric interface has considered only a simple two component structure with a top metal, most often the metal layer incorporates a 1D or 2D grating structure to provide the necessary coupling to the slow SPW and a semi-infinite dielectric layer (e.g., to allow for momentum conservation). However, a realistic detector structure has multiple dielectric layers with varying permittivities. These layers could include contact layers with p- and n-type doping, absorber layers (e.g., quantum dots or strained layer superlattices in the infrared), and electrical isolation layers (often of much lower permittivity than the semiconductor). These layers can have a profound effect on the coupling to, and even to the existence of, the SPW and need to be considered in a full device analysis and design. Additionally, this simple two material model typically does not allow for separate indentification of the useful absorption in the absorber layer and of the parasitic absorption in the metal layer and are hence not sufficient for detailed designs.

INCORPORATION BY REFERENCE

The following references are incorporated by reference in their entirety:

S. C. Lee, S. Krishna, and S. R. J. Brueck, "Light direction-dependent plasmonic enhancement in quantum dot infrared photodetectors," Applied Physics Letters 97, 02112 (2010).

S. C. Lee, Y. D. Sharma, S. Krishna, and S. R. J. Brueck, "Leaky-mode effects in plasmonic-coupled quantum dot infrared photodetectors," Applied Physics Letters 100, 011110 (2012).

S. C. Lee, S. Krishna, and S. R. J. Brueck, "Quantum dot infrared photodetector enhanced by surface plasma wave excitation," Optical Society of America, Optics Express, Vol. 17, No., Dec. 7, 2009.

S. J. Lee, Z. Ku, A. Barve, J. Montoya, W. Y. Jang, S. R. J. Brueck, M. Sundaram, A. Reisinger, S. Krishna, and S. K. Noh, "A monolithically integrated plasmonic infrared quantum dot camera," Nature Communications, DOI: 10.1038/ncomms1283.

Z. Ku, W. Y. Jang, J. Zhou, J. O. Kim, A. V. Barve, S. Silva, S. Krishna, S. R. J. Brueck, R. Nelson, A. Urbas, S. Kang, and S. J. Lee, "Analysis of subwavelength metal hole array structure for the enhancement of black-illuminated quantum dot infrared photodetectors," Optical Society of America, Optics Express, Vol. 21, No. 4, Feb. 25, 2013.

J. Chen, G. A. Smolyakov, S. R. J. Brueck, and K. J. Malloy, "Surface plasmon modes of finite, planar, metal-insulator-metal plasmonic waveguides," Optical Society of America, Optics Express, Vol. 16, No. 19, Sep. 15, 2008.

SUMMARY

In accordance with implementations consistent with the present teachings, an electromagnetic energy detector is disclosed. The detector can comprise a substrate having a first refractive index; a metal layer; an absorber layer having a second refractive index and disposed between the substrate and the metal layer; a coupling structure to convert incident radiation to a surface plasma wave; additional conducting layers to provide for electrical contact to the electromagnetic energy detector, each conducting layer characterized by a conductivity and a refractive index; a surface plasma wave ("SPW") mode-confining layer having a third refractive index that is higher than the second refractive index disposed between the substrate and the metal layer.

In implementations, the SPW mode-confining layer can be disposed between the substrate and the absorber layer.

Alternatively, the SPW mode-confining layer can be disposed between the absorber layer and the metal layer.

In implementations, the detector can comprise a top contact layer comprising a dielectric layer having a fourth refractive index that is lower than the second refractive index and disposed between the substrate and the metal layer.

In implementations, the detector can comprise a top contact layer comprising a dielectric layer having a fourth refractive index that is higher than the second refractive index and disposed between the substrate and the metal layer.

In implementations, the detector can comprise a bottom contact layer comprising a dielectric layer having a fifth refractive index that is lower than the second refractive index and the fourth refractive index and disposed between the substrate and the metal layer.

In implementations, the detector can comprise a bottom contact layer comprising a dielectric layer having a fifth refractive index that is higher than the second refractive index and the fourth refractive index and disposed between the substrate and the metal layer.

In implementations, the absorber layer can comprise a strained layer superlattice ("SLS"). In implementations, the SLS can comprise InAs: GaSb having a thickness ~0.09 μm.

In implementations, the absorber layer can comprise a plurality of quantum dots designed for absorption at the detector operating wavelength.

In implementations, the metal layer can comprise Au, Ag, or Al.

In implementations, the coupling structure can comprise an array of holes in the metal film.

In implementations, the coupling structure can comprise a semiconductor layer with post structures etched or deposited therein and the metal layer comprises a continuous metal layer.

In implementations, the coupling structure can be patterned and the metal layer can comprise a corrugated metal layer.

In implementations, the detector can further comprise at least one doped contact layer.

In implementations, the detector can further comprise at least one etch-stop layer.

In implementations, the SPW mode-confining layer can comprise Ge.

In implementations, the substrate can comprise GaSb.

In implementations consistent with the present teachings, a method of forming an electromagnetic energy detector is disclosed. The method can comprise forming a metal layer on a substrate, the substrate having a first refractive index; forming an absorber layer having a second refractive index between the substrate and the metal layer; forming a coupling structure in the vicinity of the metal layer to couple incident radiation into surface plasma waves confined to and propagating along the metal dielectric interface; and forming a surface plasma wave ("SPW") mode-confining layer having a third refractive index that is higher than the second refractive index between the substrate and the metal layer.

In implementations, the SPW mode-confining layer can be formed between the substrate and the absorber layer.

In implementations, the SPW mode-confining layer can be formed between the absorber layer and the metal layer.

In implementations, the coupling structure is formed within the evanescent length of the decay in the dielectric layer of the metal layer to couple incident radiation into surface plasma waves confined to, and propagating along the metal dielectric interface.

In implementations, a method of detecting electromagnetic radiation using the device is disclosed.

It is to be understood that both the foregoing general description and the following detailed description are exemplary and explanatory only and are not restrictive of the application, as claimed.

The accompanying drawings, which are incorporated in and constitute a part of this specification, illustrate embodiments of the application and together with the description, serve to explain the principles of the application.

DETAILED DESCRIPTION

For simplicity and illustrative purposes, the principles of the present teachings are described by referring mainly to exemplary embodiments thereof. However, one of ordinary skill in the art would readily recognize that the same principles are equally applicable to, and can be implemented in, all types of information and systems, and that any such variations do not depart from the true spirit and scope of the present teachings. Moreover, in the following detailed description, references are made to the accompanying figures, which illustrate specific exemplary embodiments. Electrical, mechanical, logical and structural changes may be made to the exemplary embodiments without departing from the spirit and scope of the present teachings. The following detailed description is, therefore, not to be taken in a limiting sense and the scope of the present teachings is defined by the appended claims and their equivalents.

Reference will now be made in detail to the exemplary embodiments. Wherever possible, the same reference numbers will be used throughout the drawings to refer to the same or like parts.

Figure 1:
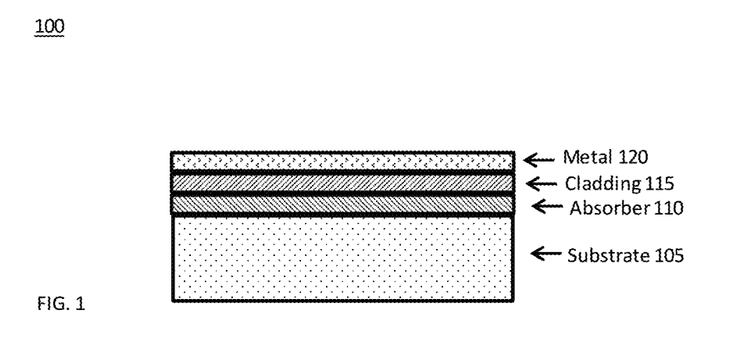
FIG. 1 illustrates a simplified schematic of a layered detector structure according to some embodiments.

FIG. 1 illustrates an example simplified schematic of a layered detector structure 100 in accordance with implementations consistent with the present teachings. While FIG. 1 illustrates various features of an example simplified schematic of a layered detector structure 100, one skilled in the art will realize that the illustrated detector structure is exemplary and that the detector structure 100 can include additional components and layers, such as heavily-doped contact layers and etch-stop layers that are used for separation of the device layers from the substrate.

As illustrated in FIG. 1, the layered detector structure 100 comprises a substrate 105 composed of, e.g., GaSb $((\epsilon_d=14.45=(3.801)^2)$, GaAs, and other bulk III-V materials, HgCdTe, an absorber layer 110, e.g., a strained layer superlattice ("SLS") absorber layer composed of materials including, but are not limited to, a lower permittivity InAs:GaSb SLS absorber layer (12.25 (InAs)<$\epsilon_d$<14.45 (GaSb) depending on the relative composition; thickness t), a plurality of quantum dots composed of InAs or InGaAs, a plurality of quantum wells composed of InGaAs and AlInGaAs, a plurality of quantum dots-in-a-well (DWELL), InAs dots in an InGaAs well, a cladding layer 115 composed of e.g., Ge with a thickness to be discussed below, GaAs, GaSb, InAs, and a metal layer 120 composed of e.g., Au, Ag (which is a better metal (lower loss) in the visible), Al is metallic to shorter wavelengths than either Au or Ag. Other materials useful for infrared photodetectors that can be used include mercury cadmium telluride (HgCdTe) and indium antimonide (InSb).

Figure 2:
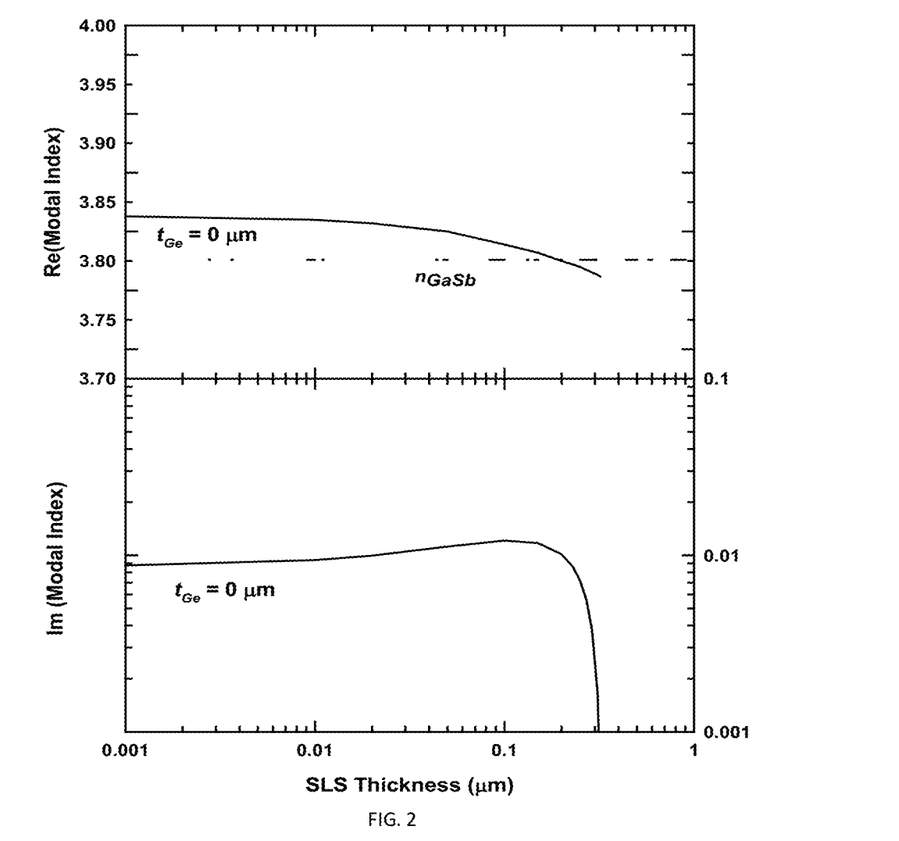
FIG. 2 shows a plot of a modal calculation for the Au surface plasma wave bound to a SLS/GaSb structure at a wavelength of 4 μm according to some embodiments.

The structure 100 of FIG. 1 can be illustrative of some of the issues encountered with theses type of devices. Often the materials of the absorber layer 110, the cladding layer 115, and the metal layer 120 have a different index of refraction than the materials of the substrate 105. If there is layer within the structure 100 composed of a material having a lower index of refraction than the substrate material, then the structure 100 can exhibit leaky mode behavior, which can result in a decrease of the coupling of light into the substrate 105 and, thus, a decrease in sensitivity of a detector comprising the structure 100. FIG. 2 shows a plot of the calculated modal behavior (real and imaginary parts) as a function of the thickness of the absorber layer 110 for a very simple structure with only a metal film (Au) for the metal layer 120, a SLS absorber layer 110 of variable thickness and a GaSb substrate 105 (e.g., no cladding layer). The calculation is for a wavelength of 4 µm, in the mid-wave infrared. A conventional transfer matrix analysis was used for this calculation as is known in the art.

As shown in FIG. 2, the loss [Im(modal index)] without any SLS thickness is the background loss associated with the metal optical properties. This is equivalent to the loss shown for a 1 nm thick SLS layer on the left hand side of FIG. 2. The excess loss as the SLS thickness is increased is the "useful" absorption that leads to electrical response of the detector. At an SLS thickness of several tenths of a µm, this loss plummets. This is the onset of the leaky mode regime as the real part of the modal index passes through the substrate index. Around this point, the mode extends deep into the substrate and there is very little of the mode intensity at the absorber and therefore a dramatic reduction in the useful absorption. This is the onset of the leaky mode regime.

Figure 3:
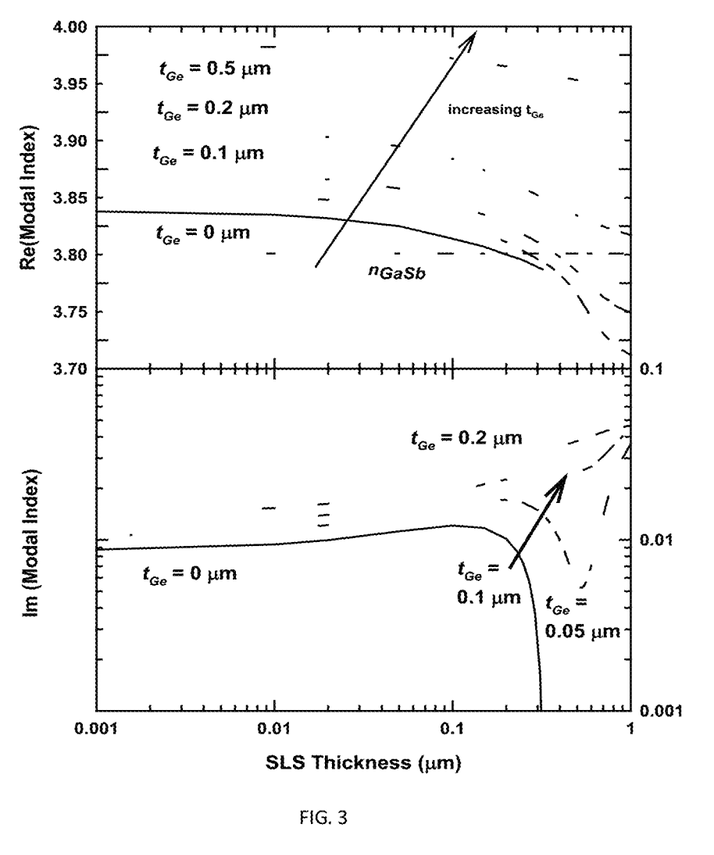
FIG. 3 shows a plot of real and imaginary parts of the modal index with the thickness of a Ge overlayer as a parameter according to some embodiments.

This issue can be resolved by adding the cladding layer 115 composed of a material having an index of refraction that is at least as high as that of the material of the substrate 105. The addition of the higher index of refraction cladding layer 115 does come with a necessary compromise. If the cladding layer 115 is too thin, the modes of incident radiation are not effectively bound to the vicinity of the absorber layer 110. If the cladding layer 115 is too thick, the absorber layer 110 becomes too distant from the strong fields of the incident radiation and results in a decrease in the absorption. These effects are illustrated in FIG. 3 which shows the modal indices (top real part, bottom imaginary part) with the thickness of a high-index Ge layer ($n_{Ge}$~4.0) as a parameter.

The results demonstrate that the SPW or other bound mode is bound to the surface of the absorber layer 110, which allows an increase in thickness of the absorber layer 110 or other layers underneath the cladding layer 115. The curve for $t_{Ge}$=0 was also shown in FIG. 2 and is repeated here. As the thickness of the cladding layer 115, composed in this example of Ge, is increased, the mode becomes increasingly bound to the surface of the absorber layer 110 and the leaky mode regime is avoided. For $t_{Ge}$=0.05 µm there is still a significant dip in the absorption that recovers as the thickness of the SLS is increased. This dip is still barely apparent for $t_{Ge}$=0.1 µm, and is entirely eliminated for $t_{Ge}$=0.2 µm.

Figure 4:
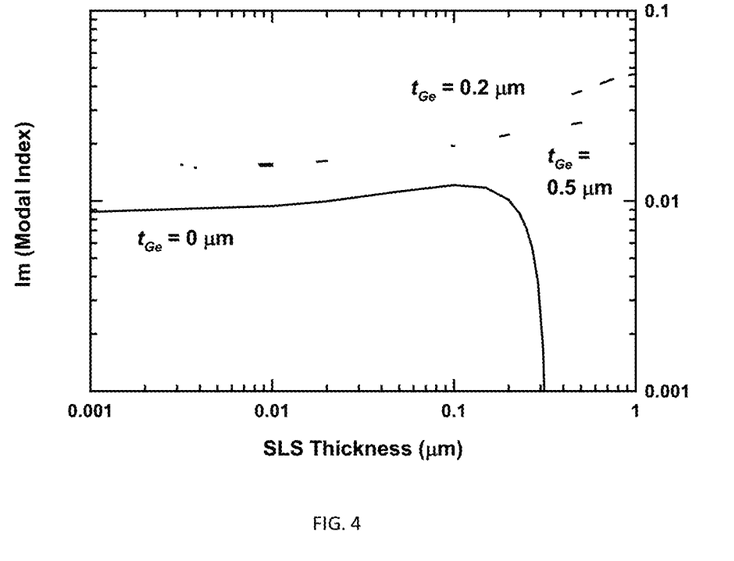
FIG. 4 shows a plot of modal loss for $t_{Ge}=0.5$ mm, where the overall loss is decreased since the absorber layer is moved deeper into the material where the fields have decay somewhat, according to some embodiments.

For still thicker Ge cladding layer 115, the absorber layer 110 is moved further into the sample, and the absorption decreases as a result of the evanescent decay of the mode into the sample. This is shown in FIG. 4 which shows the imaginary part for thicker Ge layers of 0.2- and 0.5-µm.

The above-discussed considerations can combined all of this into a figure of merit for the detector. For a conventional double pass geometry (illuminate through the substrate and reflection from a metal film on top of the epitaxy), the figure of merit is:

$$FOM = \frac{(1 - e^{-8\pi K T_{SLS}/\lambda})}{\sqrt{T_{SLS}}}$$

where K is the imaginary part of the refractive index of the absorber at wavelength λ and $T_{SLS}$ is the thickness of the SLS absorber layer. The factor of $1/\sqrt{T_{SLS}}$ accounts for the detector GR noise, proportional to the square root of the active volume. The factor of 8 is due to 2*2*2π where the first 2 is from the double pass, the second 2 is the result of considering power rather than field strength, and the 2π is just part of the wavevector $k_0$=2π/λ. For the SPW enhanced detector, the equivalent expression is:

$$FOM = \frac{\left(1 - e^{-KT_{SLS}4\pi/\lambda}\right) + e^{-KT_{SLS}4\pi/\lambda} \frac{K - K_m}{K}(1 - e^{-4\pi KP/\lambda})}{\sqrt{T_{SLS}}}$$

where the first term in the numerator accounts for the absorption on the first pass through the absorber layer 110 from the substrate side. The energy transmitted through the absorber layer 110 is then coupled to the SPW mode, the term $(K-K_m)/K$ accounts for the loss into the metal that does not provide useful signal (assuming 100% for the coupling efficiency of the radiation that passes through the absorber into the surface plasma wave at the metal:semiconductor interface). The following exponential accounts for any energy that is not absorbed within the width of the pixel P (=25 µm). The value for $K_m$ is obtained by evaluating the loss of a comparable structure without any absorption in the SLS, but with the same real part of the dielectric constant to mimic the field distribution.

Figure 5:
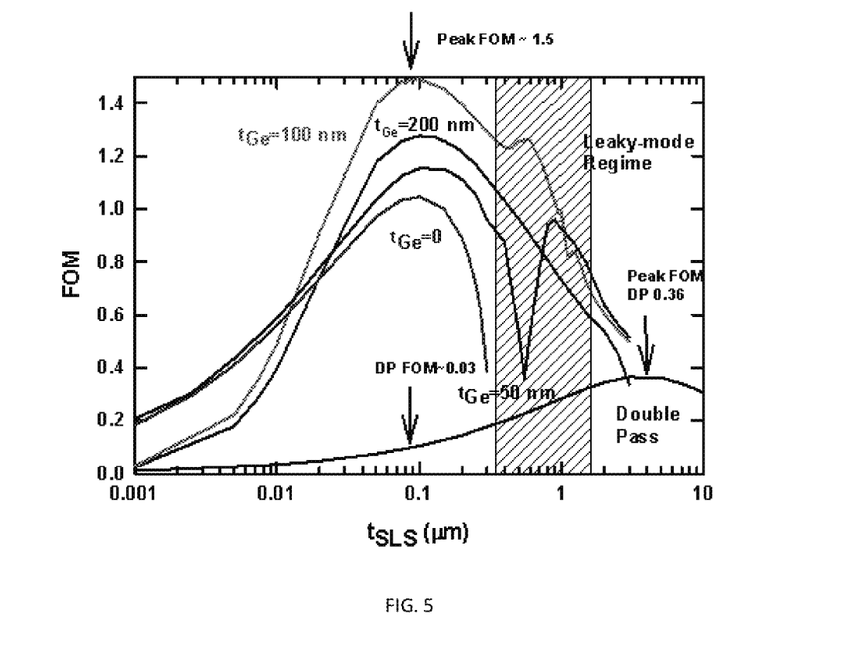
FIG. 5 shows a plot of a Figure of Merit (FOM) for an SLS SPW detector according to some embodiments.

FIG. 5 shows a plot of the FOM for an SLS SPW detector. The comparison is to a traditional double pass configuration. In the shaded region marked "Leaky Mode Regime," the values for the lossless configuration are not reliable (since some of the calculated loss is actually radiation loss). The Ge cladding layer 115 stabilizes the lossy (e.g., with SLS absorption) so that everything is well defined but there is no way to calculate the fraction of the energy absorbed in the SLS. Since this regime is not at the peak FOM, this does not impact the conclusions or design point. This calculation is for a simple structure without contact layers. These are simple to add and do not impact the conclusions.

Three points are specifically callout out (arrows) on FIG. 5. For a traditional double pass geometry the highest FOM of 0.36 is found at a SLS thickness of ~3- to 4-µm. For thinner layers there is insufficient absorption and for thicker layers the noise increases without additional absorption. In contrast, the optimal FOM for the SPW detectors is at an SLS thickness of ~0.09 µm (this does depend on the pixel width, 25 µm for this calculation). The peak FOM is about 1.5, an improvement of 420%. At the same SLS thickness, the double pass detector shows a FOM of only 0.03, a factor of 50 lower than the SPW case. This figure is at the design wavelength of the detector (which was taken as 4 µm for the calculation). The design wavelength can be shifted by changing the pitch of the coupling structure.

Figure 6:
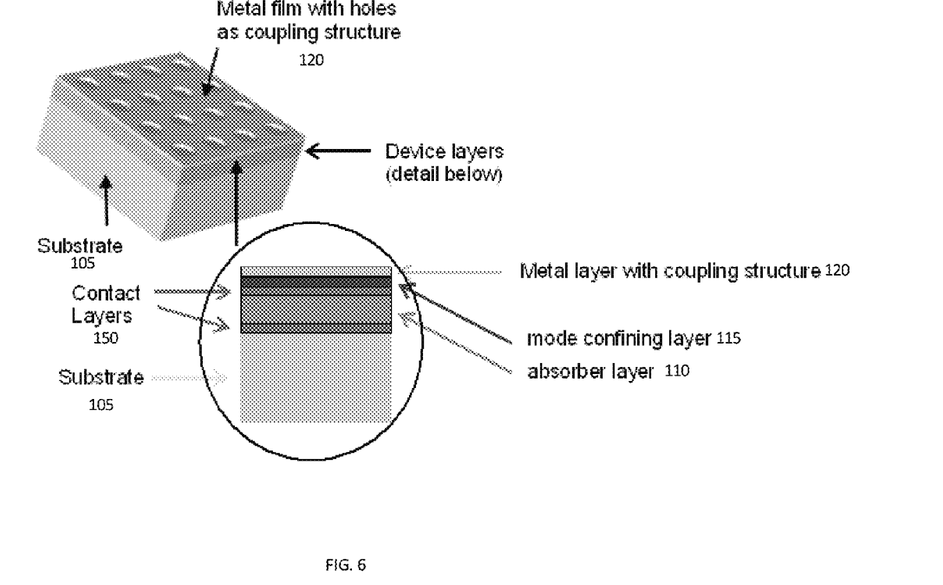
FIG. 6 shows another detector structure according to some embodiments.
Figure 7:
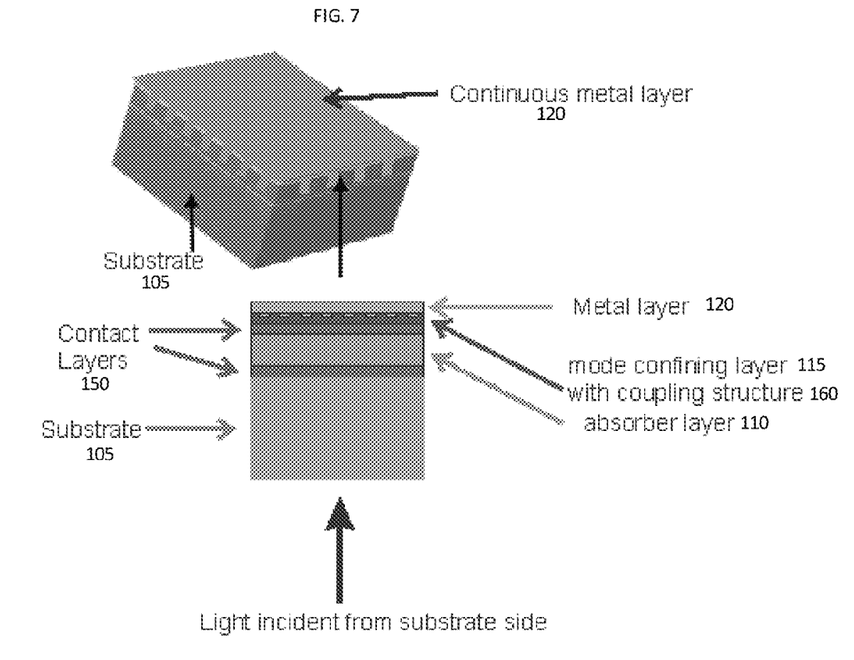
FIG. 7 shows another detector structure according to some embodiments.

As noted above, a periodic variation is needed to provide for coupling from free space radiation to the surface plasma wave. In some implementations, the metal layer, e.g., metal film 120 can be modified to include a metal photonic crystal (MPC), which is a metal film perforated with an array of holes, as shown in FIG. 6. The MPC can be substituted in place of metal layer 120 or formed on top of metal layer 120. Additionally or alternatively, the MPC can be formed at the bottom of the structure and adjacent to the substrate 105. The MPC can enhance the coupling of the incident radiation to the structure, allowing the absorber layer 110 to receive a larger portion of the incident radiation. Additionally or alternatively, the structure 100 can be modified by coupling the bottom surface of the substrate 105 with a corrugated metal surface (CMS), which is an array of posts etched into the semiconductor covered with a continuous Au film, as shown in FIG. 7. The CMS design completely decouples the optical properties from any materials, such as In-solder bumps, that are added on top of the Au film for integration with a read-out integrated circuit (ROIC). This makes the design fully compatible with existing industry manufacturing practices. The performance of the detector can be optimized for different applications (e.g., broad band vs. narrow band, coupling wavelength and coupling strength) by changing the properties of the coupling structure.

The present disclosure is not to be limited in terms of the particular embodiments described in this application, which are intended as illustrations of various aspects. Many modifications and variations can be made without departing from its spirit and scope, as is apparent. Functionally equivalent methods and apparatuses within the scope of the disclosure, in addition to those enumerated herein, will be apparent from the described descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Other embodiments of the disclosure will be apparent to those skilled in the art from consideration of the specification and practice of the embodiments disclosed herein. In particular, it should be appreciated that the processes defined herein are merely exemplary, and that the steps of the processes need not necessarily be performed in the order presented. It is intended that the specification and examples be considered as exemplary only, with a true scope and spirit of the embodiments being indicated by the following claims.

What is claimed is:

1. An electromagnetic infrared (IR) energy detector, comprising:
    a substrate having a first refractive index;
    a metal layer;
    an absorber layer having a second refractive index and disposed between the substrate and the metal layer;
    a coupling structure to convert incident radiation to a surface plasma wave;

additional conducting layers to provide for electrical contact to the electromagnetic energy detector, each conducting layer characterized by a conductivity and a refractive index; and a surface plasma wave ("SPW") mode-confining layer having a third refractive index that is higher than the second refractive index at IR wavelengths disposed between the substrate and the metal layer.

2. The electromagnetic infrared energy detector of claim 1, wherein the SPW mode-confining layer is disposed between the substrate and the absorber layer.

3. The electromagnetic infrared energy detector of claim 1, wherein the SPW mode-confining layer is disposed between the absorber layer and the metal layer.

4. The electromagnetic infrared energy detector of claim 1 further comprising a top contact layer comprising a dielectric layer having a fourth refractive index that is lower than the second refractive index and disposed between the substrate and the metal layer.

5. The electromagnetic infrared energy detector of claim 4 further comprising a bottom contact layer comprising a dielectric layer having a fifth refractive index that is lower than the second refractive index and the fourth refractive index and disposed between the substrate and the metal layer.

6. The electromagnetic infrared energy detector of claim 1 further comprising a top contact layer.

7. The electromagnetic infrared energy detector of claim 6 further comprising a bottom contact layer.

8. The electromagnetic infrared energy detector of claim 1, wherein the absorber layer comprises a strained layer super lattice ("SLS").

9. The electromagnetic infrared energy detector of claim 8, wherein the SLS comprises InAs: GaSb having a thickness ~0.09 μm.

10. The electromagnetic infrared energy detector of claim 1, wherein the absorber layer comprises a plurality of quantum dots.

11. The electromagnetic infrared energy detector of claim 1, wherein the metal layer comprises Au or Ag.

12. The electromagnetic infrared energy detector of claim 1, wherein the coupling structure comprises a hole array.

13. The electromagnetic infrared energy detector of claim 1, wherein the coupling structure comprises a semiconductor layer with post structures etched or deposited therein and the metal layer comprises a continuous metal layer.

14. The electromagnetic infrared energy detector of claim 1, wherein the coupling structure is patterned and the metal layer comprises a corrugated metal layer.

15. The electromagnetic infrared energy detector of claim 1, further comprising at least one doped contact layer.

16. The electromagnetic infrared energy detector of claim 1, further comprising at least one etch-stop layer.

17. The electromagnetic infrared energy detector of claim 1, wherein the SPW mode-confining layer comprises Ge.

18. The electromagnetic infrared energy detector of claim 1, wherein the substrate comprises GaSb.

* * * * *